(12) United States Patent
 Chang et al.

(10) Patent No.: US 9,488,791 B2
(45) Date of Patent: Nov. 8, 2016

(54) OPTOELECTRONIC MODULE

(71) Applicant: Centera Photonics Inc., Hsinchu (TW)

(72) Inventors: Chia-Chi Chang, Taipei (TW);
 Guan-Fu Lu, Taichung (TW);
 Chun-Chiang Yen, Hsinchu (TW)

(73) Assignee: Centera Photonics Inc., Hsinchu (TW)

( * ) Notice: Subject to any disclaimer, the term of this patent is extended or adjusted under 35 U.S.C. 154(b) by 0 days.

(21) Appl. No.: 14/697,640

(22) Filed: Apr. 28, 2015

(65) Prior Publication Data

US 2015/0316734 A1 Nov. 5, 2015

Related U.S. Application Data

(63) Continuation of application No. 13/426,623, filed on Mar. 22, 2012, now Pat. No. 9,057,850.

(30) Foreign Application Priority Data

Mar. 24, 2011 (TW) .............................. 100110220 A
 Sep. 9, 2011 (TW) .............................. 100132684 A
 Oct. 28, 2011 (TW) .............................. 100139464 A (51) Int. Cl.
 *H01L 33/00* (2010.01)
 *G02B 6/42* (2006.01)

(52) U.S. Cl.
 CPC ........... *G02B 6/4274* (2013.01); *G02B 6/4201* (2013.01); *G02B 6/428* (2013.01); *G02B 6/4214* (2013.01); *G02B 6/4232* (2013.01); *G02B 6/4257* (2013.01); *G02B 6/4295* (2013.01); *H01L 2224/16225* (2013.01); *H01L 2224/48091* (2013.01); *H01L 2924/15311* (2013.01)

(58) Field of Classification Search
 CPC .................................. G02B 6/42; H01L 33/00
 USPC .......................................................... 385/14
 See application file for complete search history.

(56) References Cited

U.S. PATENT DOCUMENTS

| | | | | |
|---|---|---|---|---|
| 5,701,374 A * | 12/1997 | Makiuchi | ............ | H01L 31/0232 250/227.15 |
| 6,330,377 B1 * | 12/2001 | Kosemura | ................ | G02B 6/42 385/14 |
| 6,477,286 B1 * | 11/2002 | Ouchi | ...................... | G02B 6/10 257/433 |
| 9,091,747 B2 * | 7/2015 | Pruijmboom | ........... | G01P 3/366 |
| 2002/0097962 A1 * | 7/2002 | Yoshimura | ............... | G02B 6/10 385/50 |
| 2002/0137245 A1 * | 9/2002 | Kitamura | ................. | G02B 6/42 438/22 |
| 2003/0007749 A1 * | 1/2003 | Hurt | ..................... | G02B 6/4214 385/88 |
| 2004/0017977 A1 * | 1/2004 | Lam | ..................... | G02B 6/4204 385/49 |
| 2004/0033008 A1 * | 2/2004 | Mikawa | ................... | G02B 6/43 385/14 |
| 2004/0096152 A1 * | 5/2004 | Nakama | ............ | G02B 6/12004 385/31 |
| 2005/0058408 A1 * | 3/2005 | Colgan | ............... | G02B 6/4214 385/89 |
| 2007/0165979 A1 * | 7/2007 | Oda | ....................... | H01L 25/167 385/14 |

(Continued)

*Primary Examiner* — Kaveh C Kianni
(74) *Attorney, Agent, or Firm* — Jianq Chyun IP Office (57) ABSTRACT

The present invention provides an optoelectronic module including a substrate, an optoelectronic device and a control unit. The substrate includes a top surface, a bottom surface, a concave structure, a through hole structure and a conductive material. The concave structure is disposed on the top surface. The through hole structure passes through the substrate from the top surface to the bottom surface. The conductive material is filled into the through hole structure. The optoelectronic device is disposed on the substrate for providing or receiving an optical signal. The control unit is configured on the top surface and electrically connected to the conductive material and the optoelectronic device for controlling the optoelectronic device.

7 Claims, 8 Drawing Sheets

(56) References Cited

U.S. PATENT DOCUMENTS

| | | | |
|---|---|---|---|
| 2008/0075405 A1* | 3/2008 | Wang | G02B 6/1221 385/14 |
| 2008/0175530 A1* | 7/2008 | Song | G02B 6/43 385/14 |
| 2008/0298402 A1* | 12/2008 | Rossi | H01S 5/02248 372/20 |
| 2009/0148096 A1* | 6/2009 | Yamamoto | G02B 6/42 385/14 |
| 2010/0171023 A1* | 7/2010 | Asahi | G02B 6/4201 250/205 |
| 2010/0232744 A1* | 9/2010 | Asai | G02B 6/43 385/14 |
| 2011/0188802 A1* | 8/2011 | Yanagisawa | G02B 6/12 385/14 |

* cited by examiner

OPTOELECTRONIC MODULE

CROSS-REFERENCE TO RELATED APPLICATION

This application is a continuation application of and claims the priority benefit of a prior application Ser. No. 13/426,623, filed on Mar. 22, 2012, now allowed. The prior application Ser. No. 13/426,623 claims the benefit of Taiwan application no. 100110220, filed on Mar. 24, 2011, Taiwan application no. 100132684, filed on Sep. 9, 2011, and Taiwan application no. 100139464, filed on Oct. 28, 2011. The entirety of each of the above-mentioned patent applications is hereby incorporated by reference herein and made a part of this specification.

TECHNICAL FIELD

Embodiments of the present invention generally relates to an optoelectronic module, more particularly, to an optoelectronic module integrated with an optical waveguide structure and a through silicon via (TSV).

BACKGROUND ART

Electronic devices may be equipped with a connector for electrical connection with other devices to communicate or transmit signals with other devices. However, as technology advances, electronic device's design has the trend towards light and thin. It is difficult to install the plastic body of a connector manufactured by the traditional molding method or the conductive terminals manufactured by utilizing a stamping technology in the light-thin electronic devices.

Currently, the optical coupling element as a photoelectric conversion and signal transmission has been widely used in the various circuits, the electronic device or system related. Related components are designed with smaller size for matching the optical coupling element. It will have considerable difficulty and inconvenience that the fiber is assembled or installed into the optical coupling element to conduct optical signals in or out of the optical coupling element for transmission. It even induces error, and thereby affecting transmission due to the optical signals without accurately transmitting to the fiber. Moreover, the optical fiber needs to be assembled or installed to fix within the optical coupling element such that it can not provide insertion/removal and assembly repeatedly. It is inconvenience to use due to the linear extension of the exposing outside back end of the fiber.

One kind of silicon optical bench is used for an application base of the optical interconnection of board to board or USB 3.0 optical link. Based-on the base, the structure of an optical interconnection transceiver integrated on the silicon optical bench may include a micro-reflection surface having a 45 degree angle, V-groove for fiber array, 2.5 GHz (or above 2.5 GHz) high frequency transmission line and solder bumps. By an appropriate optical alignment, a surface-emitting laser and a photo detector can be packaged onto the micro silicon optical bench.

Moreover, currently, a chip and a laser device are well developed to integrate onto a silicon optical bench. However, the chip is electrically connected to the laser device through wire bonding, and therefore impacting transmission speed between the devices.

Therefore, based-on the shortcomings, the performance of the optical connector needs to be further enhanced.

SUMMARY

Based on the above, an embodiment of the present invention provides an optoelectronic module including a substrate, a first transmission line, a second transmission line, an optoelectronic device, a light-guiding structure, and a control unit. The substrate has a top surface, a bottom surface, a through hole structure and a conductive material, wherein the top surface is opposite to the bottom surface, and the through hole structure passes through from the top surface of the substrate to the bottom surface of the substrate, the conductive material is filled into the through hole structure. The first transmission line and the second transmission line are formed on the top surface and the bottom surface of the substrate, respectively, for electrically connecting to the conductive material filled into the through hole structure. The optoelectronic device is disposed on the substrate and coupled to the first transmission line, wherein the optoelectronic device is capable of emitting or receiving an optical signal. The light-guiding structure is configured on the substrate. The control unit is coupled to the optoelectronic device via the first transmission line, the second transmission line and the conductive material.

An embodiment of the present invention provides an optoelectronic module including a substrate, an optoelectronic device, a light-guiding structure, and a control unit. The substrate has a top surface, a bottom surface, a first concave structure, a first through hole structure and a first conductive material, wherein the top surface is opposite to the bottom surface, and the first concave structure is formed on the top surface, the first through hole structure passes through from a bottom surface of the first concave to the bottom surface of the substrate, and the first conductive material is filled into the first through hole structure. The optoelectronic device is disposed on the substrate, wherein the optoelectronic device is capable of emitting or receiving an optical signal. The light-guiding structure is configured on the concave structure. The control unit is disposed in the first concave structure and coupled to the first conductive material and the optoelectronic device for controlling the optoelectronic device.

An embodiment of the present invention provides an optoelectronic module including a first substrate, an optoelectronic device, a light-guiding structure, an upper structure, a first through hole structure, a conductive material, and a control unit. The first substrate has a top surface, a bottom surface, a concave structure, wherein the top surface is opposite to the bottom surface, and the concave structure is formed on the top surface. The optoelectronic device is disposed in the concave structure, wherein the optoelectronic device is capable of emitting or receiving an optical signal. The light-guiding structure is configured on the top surface of the first substrate. The upper structure is disposed above the first substrate and combines with the first substrate to fix the light-guiding structure, wherein the upper structure has a reflection surface for transmitting the optical signal between the optoelectronic device and the light-guiding structure. The first conductive material is filled into the first through hole structure. A control unit is coupled to the first conductive material and the optoelectronic device for controlling the optoelectronic device.

An embodiment of the present invention provides an optoelectronic module including a substrate, an optoelectronic device, and a control unit. The substrate has a top surface, a bottom surface, a concave structure, a through hole structure and a conductive material, wherein the top surface is opposite to the bottom surface, the concave structure is formed on the top surface and has a first reflection surface and a second reflection surface opposite to the first reflection surface, the through hole structure passes through from the top surface to the bottom surface of the substrate, and the conductive material is filled into the through hole structure. The optoelectronic device is disposed on the substrate, wherein the optoelectronic device is capable of emitting or receiving an optical signal. The control unit is disposed on the top surface of the substrate and coupled to the conductive material and the optoelectronic device for controlling the optoelectronic device.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

References in the specification to "one embodiment" or "an embodiment" refers to a particular feature, structure, or characteristic described in connection with the preferred embodiments is included in at least one embodiment of the present invention. Therefore, the various appearances of "in one embodiment" or "in an embodiment" do not necessarily refer to the same embodiment. Moreover, the particular feature, structure or characteristic of the invention may be appropriately combined in one or more preferred embodiments.

Figure 1:
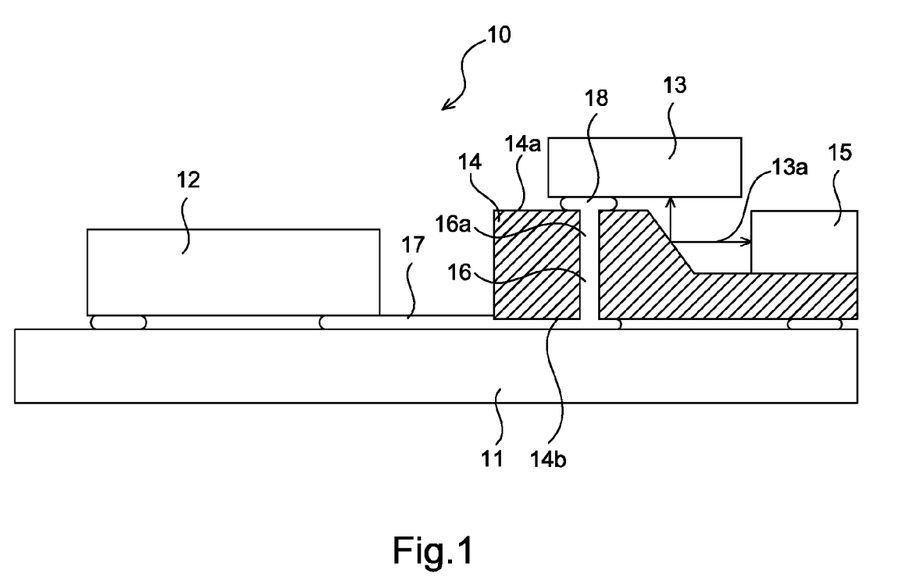
FIG. 1 illustrates an optoelectronic module according to one embodiment of the present invention.

FIG. 1 shows an optoelectronic module of an embodiment of the present invention. In this embodiment, the optoelectronic module 10 may be as a passive optical interconnection transmitter or receiver. For example, the optoelectronic module 10 includes a semiconductor substrate 14, a control chip 12, an optoelectronic device 13 and a light-guiding structure 15. In other words, the present invention may utilize the light-guiding structure 15 for unidirectional or bidirectional transmission. The substrate 14 has a top surface 14a, a bottom surface 14b, a through hole structure 16 and a conductive material 16a, wherein the top surface 14a is opposite to the bottom surface 14b, the through hole structure 16 passes through from the top surface 14a to the bottom surface 14b of the substrate 14, and the conductive material 16a is filled into the through hole structure 16. The semiconductor substrate 14 and the control chip 12 are configured on the print circuit board (PCB) 11, and the optoelectronic device 13 is configured on the semiconductor substrate 14. The control chip 12 is for example a driver integrated circuit (IC) or a trans-impedance amplifier (TIA) chip, wherein the driver IC may be used to drive the optoelectronic device 13 for emitting light. For example, the semiconductor substrate 14, such as silicon sub-mount, is used to be as a silicon optical bench, and has a concave bench for facilitating the light-guiding structure 15 to be disposed thereon, and a reflection surface having a specified angle (such as 45 degree angle). The reflection surface may be an optical surface required for various optoelectronic devices. A transmission line (trace) 18 is formed on the top surface 14a of the semiconductor substrate 14 for electrically connecting to the optoelectronic device 13. The optoelectronic device 13 may be a light emitting or receiving element, for example a laser, a photo detector or a light emitting diode (LED). The laser is a vertical-cavity surface-emitting laser (VCSEL), for example.

The transmission line 18 of the embodiment of the present invention is coupled to the PCB 11 via the conductive material 16a filled into the through hole structure 16 and a transmission line (trace) 17 formed on the bottom surface 14b of the substrate 14, and coupled to the control chip 12 via circuits on the PCB 11. In other words, the control chip 12 is coupled to the PCB 11 via the transmission line 17, and the optoelectronic device 13 is coupled to the PCB 11 via the transmission line 18, the conductive material 16a filled into the through hole structure 16 and the transmission line 17. Therefore, the control chip 12 is coupled to the optoelectronic device 13 via the transmission line 18, the conductive material 16a filled into the through hole structure 16 and the transmission line 17. The transmission line 18 and 17, such as 10 GHz or more high frequency transmission line, are formed on the top surface 14a and the bottom surface 14b of the semiconductor substrate 14, respectively for electrically connecting to the control chip 12 and the optoelectronic device 13.

As above mentioned, the control chip 12 and the optoelectronic device 13 can be electrically communicated with each other by the transmission line, and then transmit/receive optical signals to/from the external device via the light-guiding structure 15. In other words, optical signals can be formed a bidirectional transmission between the external device and the optoelectronic device 13. For example, the light-guiding structure 15 is as an interface of optical output and input which may be adapted by a fiber, a waveguide or a jumper to transmit signals.

In one embodiment, the semiconductor substrate 14 has a concave structure formed a specified depth beneath thereof. The first end of the concave structure forms a reflection surface, and a plurality of grooves are formed on the concave structure. Based-on the grooves of the concave structure, the light-guiding structure 15 may be passively aligned to the grooves.

For example, the optoelectronic device 13 is configured adjacent to the first end of the concave structure and coupled to the light-guiding structure 15 through the reflection surface. Therefore, the optical path 13a of the optoelectronic device 13 includes the optical signal emitted by the optoelectronic device 13 is reflected by the reflection surface to enter into the light-guiding structure 15, or the optical signal passing through the light-guiding structure 15 is reflected by the reflection surface to enter into the optoelectronic device 13.

Figure 2:
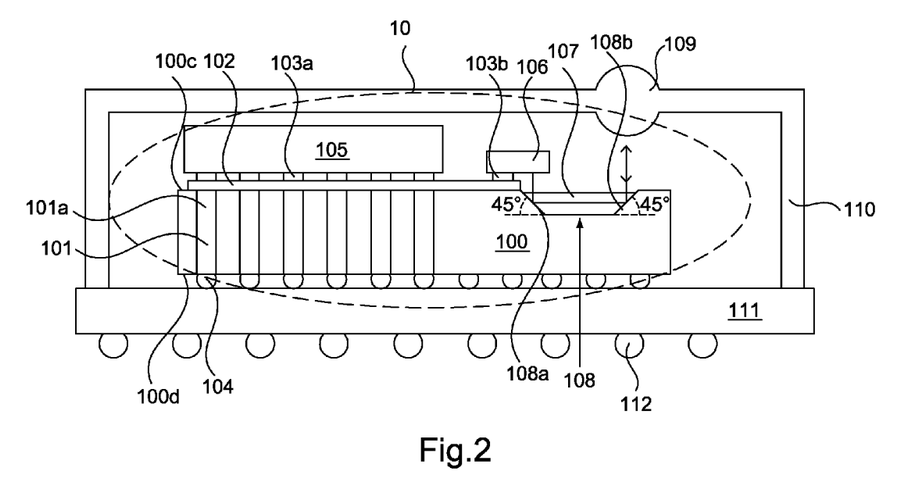
FIG. 2 illustrates an optoelectronic module according to another embodiment of the present invention.

FIG. 2 shows an optoelectronic module of an embodiment of the present invention. In this embodiment, the optoelectronic module 10 may be as a passive optical interconnection transmitter or receiver. For example, the optoelectronic module 10 includes a semiconductor substrate 100, a fan-out conductive pattern 102, top solder bumps 103*a*/103*b*, bottom solder bumps 104, a control chip 105, an optoelectronic device 106 and a light-guiding structure 107. The substrate 100 has a top surface 100*c*, a bottom surface 100*d*, a concave structure 108, a first through hole structure 101 and a first conductive material 101*a*, wherein the top surface 100*c* is opposite to the bottom surface 100*d*, and the concave structure 108 is formed on the top surface 100*c* and has a first reflection surface 108*a* and a second reflection surface 108*b* opposite to each other. The first through hole structure 101 passes through from the top surface 100*c* to the bottom surface 100*d* of the substrate 100. The first conductive material 101*a* is filled into the first through hole structure 101 to form a TSV (through silicon via). The TSV is electrically connected to the fan-out conductive pattern 102. The fan-out conductive pattern 102 is formed on the top surface 100*c* of the substrate 100. The top solder bumps 103*a*/103*b* are directly electrically connected to the control chip 105, the optoelectronic device 106 and the fan-out conductive pattern 102 respectively, or electrically connected to the control chip 105 and the optoelectronic device 106 via the fan-out conductive pattern 102. In other words, the control chip 105 is electrically connected to the optoelectronic device 106 via the fan-out conductive pattern 102, and the control chip 105 is electrically connected to the laminate board 111 through the top solder bumps 103*a* and via the fan-out conductive pattern 102 and the conductive material 101*a*. In such embodiment, the top solder bumps 103*a* is electrically connected to the fan-out conductive pattern 102.

Pins of the bottom surface of the control chip 105, for example solder bumps, may be fan out to outside of the coverage area of the control chip 105 by utilizing the fan-out conductive pattern 102 for providing a better connection to other devices and to reduce the electromagnetic interference between the pins.

For example, the substrate 100 is a silicon interposer 100. The light-guiding structure 107 is an optical waveguide structure disposed in the concave structure 108 and located between the first reflection surface 108*a* and the second reflection surface 108*b*. The concave structure 108 formed on the substrate 100 may be used as a silicon optical bench 108. The first reflection surface 108*a* and the second reflection surface 108*b* are respectively located at opposite sides of the concave structure 108. Each of the first reflection surface 108*a* and the second reflection surface 108*b* has a 45 degree included angle as optical micro-reflection surface required for various optoelectronic devices. The optoelectronic device 106 may be configured adjacent one side of the concave structure 108, for example the first reflection surface 108*a*. For example, the optoelectronic device 106 is configured on the substrate 100, wherein the optoelectronic device 106 may be capable of emitting or receiving optical signals. The first reflection surface 108*a* and the second reflection surface 108*b* are located on the optical paths of the optical signals. For example, the light-guiding structure 107 includes the polymer material with refractive index about 1.4 to 1.6, which may be manufactured by a thin film deposition process to achieve the effect of waveguide. Depending on the practical application, the light-guiding structure 107 can be chosen to fill or not fill into the concave structure 108.

In one embodiment, the substrate 100 may be used as a sub-mount of a driver IC/a trans-impedance amplifier or a vertical-cavity surface-emitting laser (VCSEL)/a photo detector (PD). Moreover, the substrate 100 may be also integrated with other logic device, a memory or integrated passive devices (IPD) formed thereon. In another embodiment, the substrate 100 may be integrated with a processing chip, a central processing unit, a video chip, a sound chip or a data chip formed thereon.

The optoelectronic module 10 further includes a laminate board or plate 111 configured under the substrate 100, and the bottom solder bumps 104 are coupled to the laminate board 111 and the conductive material 101*a*. In another embodiment, a second fan-out conductive pattern (not shown) may be optionally configured under the bottom surface 100*d* of the substrate 100 and connected to the bottom solder bumps 104. Pins of the bottom surface 100*d* of the substrate 105 may be fan out by utilizing the second fan-out conductive pattern for providing a better connection to other devices and to reduce the electromagnetic interference between the pins. The laminate board 111 is for example a PCB, with solder bumps 112 formed under the laminate board 111 for coupling to the external device. Besides, the optoelectronic module 10 further includes a housing 110 with a light modulating component 109. The position of the light modulating component 109 corresponds to that of the second reflection surface 108*b* and the light modulating component 109 is located on the optical paths of the optical signals. The light modulating component 109 is for example a lens. In an example, the whole substrate 100 is sealed on the laminate board 111 by utilizing the housing 110. The control chip 105 is a control unit configured on the top surface 100*c* of the substrate 100 and electrically connects to the TSV and the optoelectronic device 106 for controlling the optoelectronic device 106.

In one embodiment, the substrate 100 is used as a silicon interposer material. As the substrate 100 is coupled to the lower laminate board 111, it needs to meet the requirement of trace accuracy for the laminate board 111. As the laminate board 111 is a PCB, it needs to meet the requirement of process accuracy of the PCB 111 for the bottom solder bumps 104 under the substrate 100. In other words, in order to make the control chip 105 couple to the lower printed circuit board 111, the bottom solder bumps 104 is electrically fan out via the second fan-out conductive pattern, and the spacing setting of the bottom solder bumps 104 depends on the accuracy demand of the PCB 111. As the laminate board 111 is an alumina substrate or a ceramic base, the spacing of the bottom solder bumps 104 under the substrate 100 may be smaller.

The depth of the TSV depends on the through-hole type (pre-formed through-hole or post-formed through-hole) and its application. The depth of the TSV is 20~500 micron, preferably about 50~250 micron. The through-hole opening of the TSV has a via size, for example a diameter 20~200 micron, preferably about 25~75 micron. The aspect ratio of the TSV is 0.3:1 to larger than 20:1, for example about 4:1 to 15:1.

In one embodiment, the through-hole of the TSV, i.e. the first through-hole structure 101, includes an opening at the top surface 100*c* of the substrate 100, a sidewall extending from the top surface 100*c* of the substrate 100 and a bottom part. The method for forming the TSV includes a process of the substrate 100 immersing in electrolytic metal (for example copper) deposition compositions. The electrolytic metal deposition compositions include a metal (for example copper) ion source, acid (inorganic acid, organic acid, and/or mixture), one or more organic compounds (facilitating the speed of copper deposition at the bottom of the through-hole faster than that at the opening of the through-hole) and chloride ion. Next, the current is supplied to the electrolytic copper deposition compositions such that cooper is deposited on the bottom and the sidewalls for filling from the bottom to the top, and thereby forming the TSV with copper filler. In the embodiment, the first conductive material 101a includes copper.

The control chip 105 is for example a driver IC or a trans-impedance amplifier (TIA) chip, wherein the driver IC can be used for driving the optoelectronic device 106 for light emitting. The control chip 105 and the optoelectronic device 106 are coupled to the top solder bumps 103a/103b via the fan-out conductive pattern 102 for electrical communication with each other. The control chip 105 is electrically communication with the laminate board 111 via the top solder bumps 103a, the fan-out conductive pattern 102, the first through hole structure 101 and the bottom solder bumps 104 under the control chip 105. The conductive material 101a is electrically connected to the fan-out conductive pattern 102 and the bottom solder bumps 104. The optoelectronic device 106 may be a light emitting or receiving element, for example a VCSEL, a photo detector or a LED. For the light emitting element, the optoelectronic device 106 is utilized to create or emit the corresponding converted light beam or optical signals for transmission, according to the electrical signals transmitted by the control chip 105. Laser beam emitted by the optoelectronic device 106 is reflected by the first reflection surface 108a, and then through the light-guiding structure 107 for transmission inside, followed by through the second reflection surface 108b to guide the laser beam perpendicular out of the substrate 100. For example, the optical path of the emitting light of the optoelectronic device 106 includes light emitting out of the optoelectronic device 106→the light-guiding structure 107→the reflection surface 108a having the 45 degree angle→the light-guiding structure 107 transmission inside→the reflection surface 108b having the 45 degree angle→the light-guiding structure 107→light exit out of the light-guiding structure 107→passing through the light modulating component 109 for coupling to the external optoelectronic device. The optical path of the receiving light of the optoelectronic device 106 is opposite the above optical path of the emitting light, wherein the optoelectronic device 106 is as a receiving terminal.

In one embodiment, the laser beam exit out of the light-guiding structure 107 may be modulated by the light modulating component 109 for coupling to an external fiber or other light-guiding structure. In one embodiment, the tolerance of structural error of the light modulating component 109 is ±10 micron, and the tolerance of alignment error of the light modulating component 109 is ±20 micron. The light modulating component 109 may be an optical lens or a collimation lens. The optical lens is for example a plastic optical lens.

Figure 3:
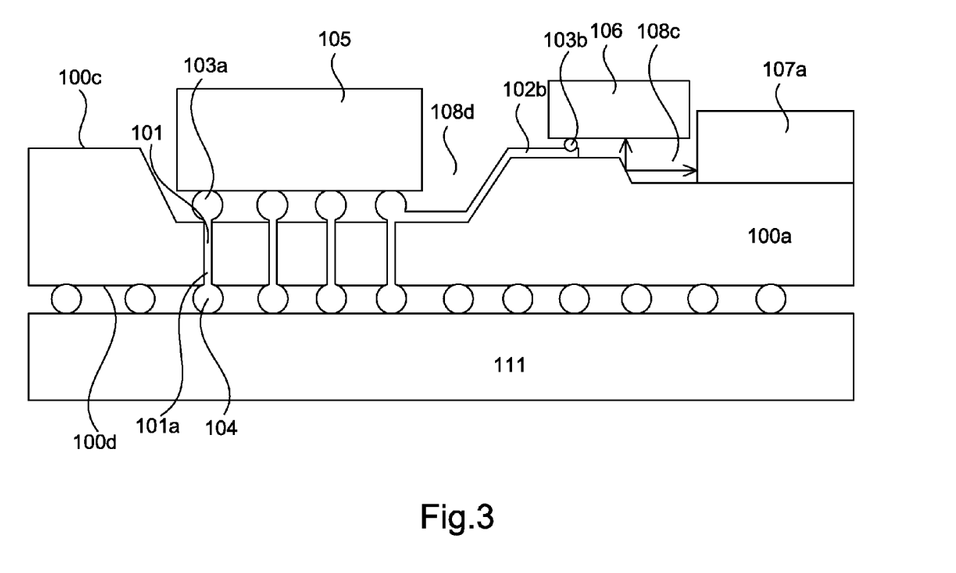
FIG. 3 illustrates an optoelectronic module according to yet another embodiment of the present invention.

FIG. 3 shows an optoelectronic module of another embodiment of the present invention. In this embodiment, the substrate 100a includes two concave structures (a first concave structure 108d, a second concave structure 108c) formed on the substrate 100a. The light-guiding structure 107a is configured inside the second concave structure 108c, and the light-guiding structure 107a is for example a fiber. The optoelectronic device 106 may be configured adjacent to the side of the second concave structure 108c, and the control chip 105 is configured inside the first concave structure 108d. Besides, the side of the second concave structure 108c adjacent to the optoelectronic device 106 may be designed as a reflection surface having a 45 degree angle. In this embodiment, the depth of the TSV may be reduced by forming the first concave structure 108d, and therefore the TSV is easy to make. The first concave structure 108d may be formed by optionally selecting a wet etching process, a dry etching process or a wet/dry etching. Moreover, the high frequency trace 102b is formed on the bottom surface of the first concave structure 108d and the side of the first concave structure 108d and partial top surface 100c of the substrate 100a, and electrically connected to the control chip 105 and the optoelectronic device 106 via the top solder bumps 103 and 103b. In this embodiment, ball grid array (BGA) type package structure may be utilized to connect a PCB 111 without wire-bonding.

Figure 4:
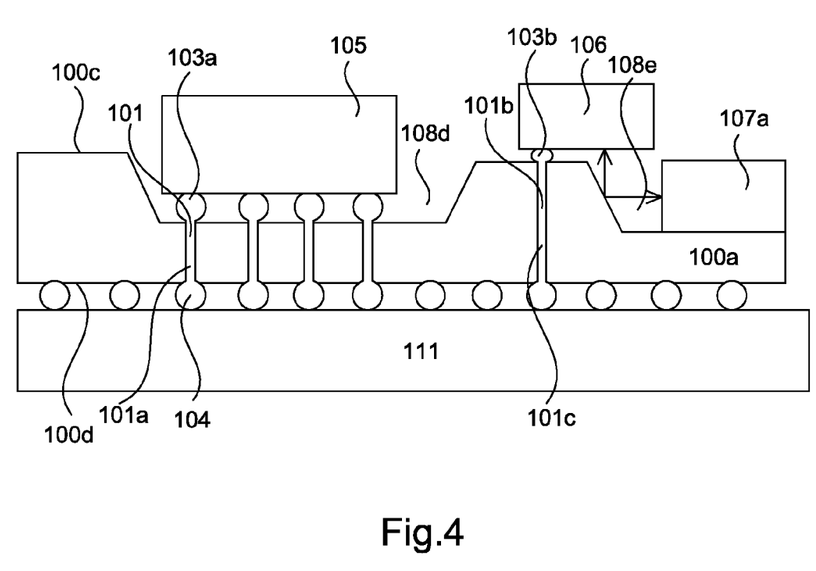
FIG. 4 illustrates an optoelectronic module according to one embodiment of the present invention.

FIG. 4 shows an optoelectronic module of an embodiment of the present invention. In this embodiment, the depth of the second concave structure 108e is different from that of the second concave structure 108c of the FIG. 3. For example, the second concave structure 108e and the first concave structure 108d is formed by utilizing an identical etching process, and therefore the depth of the two structures is substantially the same which may be larger than the depth of the second concave structure 108c of the FIG. 3.

In this embodiment, the substrate 100a has the first through-hole structure 101 formed therein, from the bottom surface of the first concave structure 108d extending to the lower surface 100d of the substrate 100a which is filled by a first conductive material 101a to form the first TSV. The substrate 100a has the second through-hole structure 101b formed therein, from the top surface 100c of the substrate 100a extending to the lower surface 100d of the substrate 100a. A second conductive material 101c is filled into the second through-hole structure 101b to form the second TSV for coupling to the optoelectronic device 106.

The second through-hole structure 101b passes through the substrate 100a under the optoelectronic device 106 for coupling to the optoelectronic device 106 and the PCB 111 via solder bumps 103b and 104. Therefore, in this embodiment, the second through-hole structure 101b may be directly made under the optoelectronic device 106, and the control chip 105 and the optoelectronic device 106 may be integrated together via the first through-hole structure 101 and the second through-hole structure 101b without above high frequency trace 102b. The optoelectronic device 106 may be coupled to the control chip 105 via the first through-hole structure 101, the PCB 111 and the second through-hole structure 101b.

Figure 5:
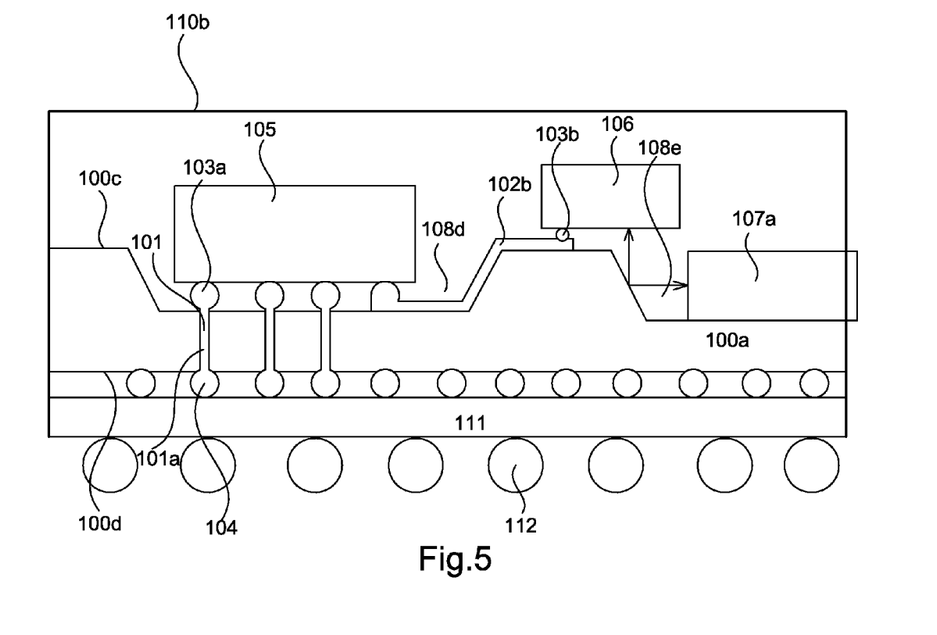
FIG. 5 illustrates an optoelectronic module according to another embodiment of the present invention.
Figure 6:
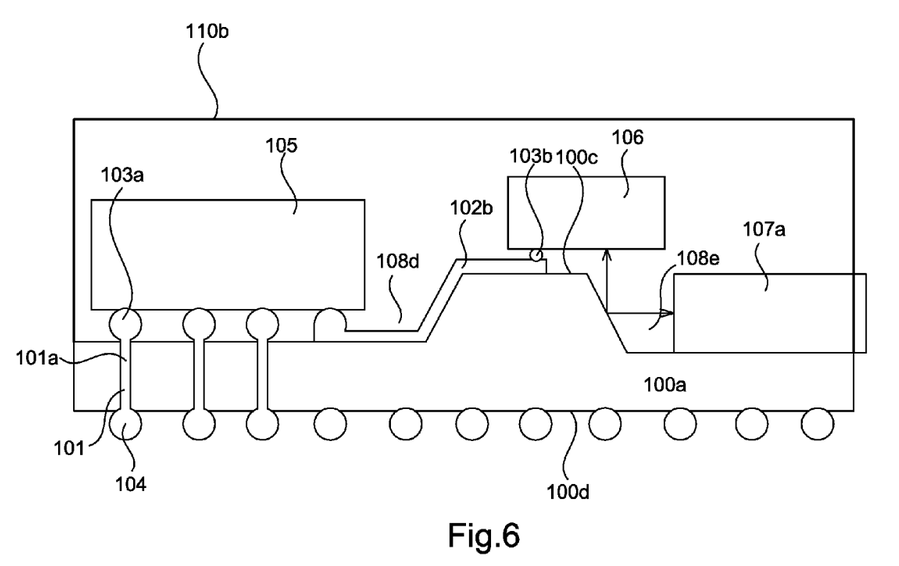
FIG. 6 illustrates an optoelectronic module according to yet another embodiment of the present invention.

FIG. 5 shows an optoelectronic module of an embodiment of the present invention. In this embodiment, for OE IC type or BGA type package structure, it can be connected to the ceramic substrate structure 111. Moreover, a case 110b covers to protect the whole optoelectronic module from external environmental contamination. For example, solder bumps 112 exposes outside the case 110b for facilitating coupling to the external device. In another example, the case 110b only covers the optoelectronic device 106, the control chip 105 and the light-guiding structure 107a above the substrate 100a, shown in the FIG. 6.

Figure 7:
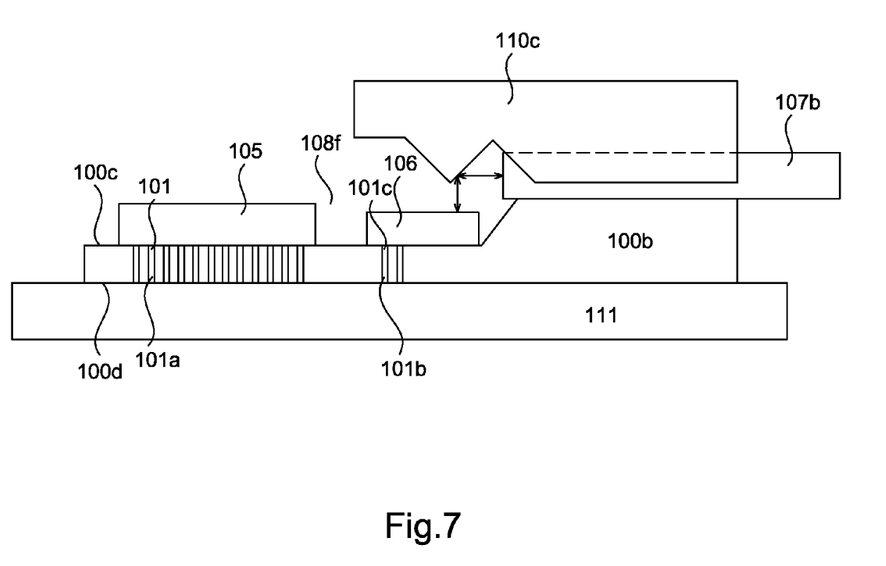
FIG. 7 illustrates an optoelectronic module according to further embodiment of the present invention.

FIG. 7 shows an optoelectronic module of yet another embodiment of the present invention. In this embodiment, the substrate 100b has a concave structure 108f, and the optoelectronic device 106 and the control chip 105 are configured and integrated on the concave structure 108f of the substrate 100b. The optoelectronic device 106 and the control chip 105 are coupled to the PCB 111 via the first conductive material 101a and the second conductive material 101c respectively. The light-guiding structure 107a is configured on the substrate 100b. The substrate 100b is located on the PCB 111. For example, the active region and contact pads of the optoelectronic device 106 are located at the same side. In this embodiment, the optoelectronic module further includes a upper structure 110c configured over the light-guiding structure 107b, which may combines with the substrate 100b to fix the light-guiding structure 107b. The upper structure 110c has a reflection surface having a 45 degree angle for facilitating light emitting of the optoelectronic device 106 in the vertical direction to propagate horizontally forward to the light-guiding structure 107b and then transmit to the outside by reflection of the reflection surface having the 45 degree angle. In this embodiment, the optoelectronic device 106 is coupled to the control chip 105 via the first conductive material 101a, the PCB 111 and the second conductive material 101c.

The substrate 100b has the first through-hole structure 101 formed therein, from the bottom surface of the concave structure 108f extending to the lower surface 100d of the substrate 100b. The first conductive material 101a is filled into the first through-hole structure 101 to form TSV for coupling to the control chip 105. The substrate 100b has the second through-hole structure 101b formed therein, from the bottom surface of the concave structure 108f extending to the lower surface 100d of the substrate 100b. The second conductive material 101c is filled into the second through-hole structure 101b to form TSV for coupling to the optoelectronic device 106.

Figure 8:
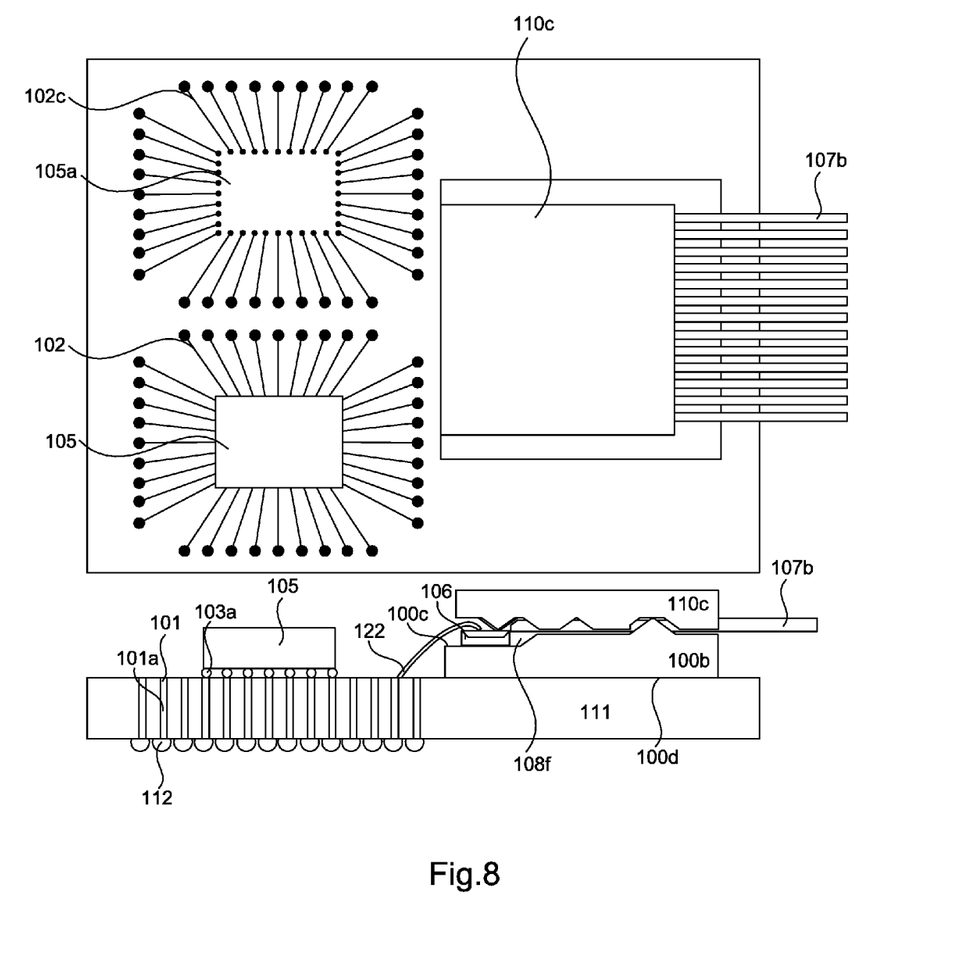
FIG. 8 illustrates an optoelectronic module according to yet another embodiment of the present invention.

Moreover, as shown in FIG. 8, in another embodiment, only the optoelectronic device 106 is configured on the concave structure 108f of the substrate 100b, and the control chip 105 is configured on another substrate, for example a ceramics sub-mount 111. The top solder bumps 103a is located on the ceramics sub-mount 111, and the conductive material 101a is filled into the first through hole structure 101 of the substrate 100b to form a TSV. The first through hole structure 101 is formed in the ceramics sub-mount 111 for electrically connecting the top solder bumps 103a and solder bumps 112. The control chip 105 is coupled to the conductive material 101a via the top solder bumps 103a and coupled to the solder bump 112 under the ceramics sub-mount 111 via the conductive material 101a. A wire-bonding 122 is electrically connected to the optoelectronic device 106 and the conductive material 101a. Based-on the ceramics sub-mount structure, in this embodiment, it may be integrated to BGA type or LGA (Land Grid Array) type OE IC chip. In this embodiment, it further includes another control chip 105a coupled to other device via a fan-out conductive pattern 102c. The control chip 105a may be coupled to traces of the ceramics sub-mount 111 via the conductive material 101a. The optoelectronic device 106 is coupled to the control chip 105 and/or the control chip 105a via the conductive material 101a, solder bumps 103a above the ceramics sub-mount 111 and a wire bonding 122.

The optoelectronic module may be connected to a fiber connector for transmitting optical signals to the external device.

As mentioned above, the embodiments of the present invention provide a newly optoelectronic module which integrates an optical waveguide structure and a through silicon via (TSV) such that the control IC and VCSEL/PD may be integrated into a single substrate.

The TSV, the light-guiding structure (such as waveguide) and the reflection surface having the 45 degree angle are integrated to a substrate such that the electrical signals may be sent to a specified IC via the TSV, and further driving active device VCSEL for emitting light. The optical signals enter into the light-guiding structure, and then twice reflecting via the reflection surface having the 45 degree angle to turn the light beam forward to up emitting. The light-guiding structure can re-guide the light beam with high efficiency. Moreover, such design of forward emitting light may be facilitating adjusting the light beam by the follow-up optical lens.

Due to the TSV, IC and VCSEL/PD may be directly integrated into the optoelectronic module package without wire bonding, and therefore the embodiments of the present invention obtain a promotion in high frequency, high speed transmission and device assembly speed. Material of the light-guiding structure may be selected from polymer material with refractive index about 1.4 to 1.6, or made by a thin film depositing process to reach the waveguide effect.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. An optoelectronic module, comprising:
   a substrate, having a top surface, a bottom surface, a first concave structure, a first through hole structure and a first conductive material, wherein said top surface is opposite to said bottom surface, said first concave structure is formed on said top surface, said first through hole structure passes through from said top surface to said bottom surface of said substrate, and said first conductive material is filled into said first through hole structure;
   an optoelectronic device, disposed on said substrate, wherein said optoelectronic device is capable of emitting or receiving an optical signal;
   a light-guiding structure disposed on said first concave structure, wherein said first concave structure has a reflection surface capable of transmitting said optical signal between said light-guiding structure and said optoelectronic device; and
   a control unit, disposed on said top surface and coupled to said first conductive material and said optoelectronic device for controlling said optoelectronic device.

2. The optoelectronic module of claim 1, further comprising a second concave structure formed on said top surface of said substrate, wherein the control unit is disposed in said second concave structure.

3. The optoelectronic module of claim 1, further comprising a high frequency trace formed on said top surface of said substrate, wherein said control unit is coupled to said optoelectronic device via said high frequency trace.

4. The optoelectronic module of claim 3, further comprising a plurality of first solder bumps formed between said control unit and said substrate, wherein said control unit is coupled to said first conductive material and said high frequency trace via said plurality of first solder bumps.

5. The optoelectronic module of claim 3, further comprising at least one second solder bumps formed between said optoelectronic device and said substrate, wherein said optoelectronic device is coupled to said high frequency trace via said at least one second solder bumps.

6. The optoelectronic module of claim 1, further comprising a second through hole structure and a second conductive material, wherein said second through hole structure passes through from top surface of said substrate to said bottom surface of said substrate, and said second conductive material is filled into said second through hole structure, and said second conductive material is coupled to said optoelectronic device.

7. The optoelectronic module of claim 6, further comprising a print circuit board located under said substrate and coupled to said first conductive material and said second conductive material.

* * * * *